United States Patent [19]
Fujimura et al.

[11] Patent Number: 5,998,104
[45] Date of Patent: *Dec. 7, 1999

[54] METHOD OF STRIPPING A RESIST MASK

[75] Inventors: Shuzo Fujimura, Tokyo; Keisuke Shinagawa, Kawasaki; Naomichi Abe, Tokyo, all of Japan

[73] Assignee: Fujitsu Limited, Kawasaki, Japan

[ * ] Notice: This patent is subject to a terminal disclaimer.

[21] Appl. No.: 08/972,251

[22] Filed: Nov. 18, 1997

Related U.S. Application Data

[62] Division of application No. 08/193,893, Feb. 9, 1994, which is a continuation of application No. 08/069,402, Apr. 30, 1993, abandoned, which is a continuation of application No. 07/590,595, Sep. 27, 1990, abandoned, which is a continuation of application No. 07/232,096, Aug. 15, 1988, abandoned.

[30] Foreign Application Priority Data

Aug. 19, 1987 [JP] Japan ................................ 62-203985

[51] Int. Cl.$^6$ .................... B03F 7/42; C23C 15/00
[52] U.S. Cl. ................ 430/329; 430/330; 156/345; 156/643.1; 156/646.1; 204/192.36; 204/192.37; 204/298.31; 204/298.33
[58] Field of Search ............... 430/329; 156/345; 156/643.1, 646.1; 204/192.36, 192.37, 298.31, 298.33

[56] References Cited

U.S. PATENT DOCUMENTS

| | | | |
|---|---|---|---|
| 3,837,856 | 9/1974 | Irving et al. | 430/311 |
| 4,292,384 | 9/1981 | Staughan et al. | 430/5 |
| 4,512,868 | 4/1985 | Fujimura et al. | 204/298 |
| 4,983,254 | 1/1991 | Fujimura et al. | 156/643 |
| 4,987,284 | 1/1991 | Fujimura et al. | 219/121.43 |
| 5,057,187 | 10/1991 | Shinagawa et al. | 438/725 |

FOREIGN PATENT DOCUMENTS 216603 4/1987 European Pat. Off. .

OTHER PUBLICATIONS

Journal of the Electrochemical Society, vol. 129, No. 11, Nov. 1982, "Decapsulation and Photoresist Stripping in Oxygen Microwave Plasmas", Z. Zioba et al., pp. 2537–2541.

Journal of the Electrochemical Society, vol. 124, No. 1, Jan. 1977, "The Reduction of Photoresist Stripping Rates in an Oxygen Plasma By–Product Inhibition and Thermal Mass," J.F. Battey, pp. 147–152.

Extended Abstracts, vol. 83, No. 1, May 1983, "A New High Efficiency, Sub–Megahertz Exitation Frequency, Inductively Coupled Plasma Generator for High Rate Downstream Photo–Resist Stripping and Isotropic Etching", C.B. Zarowin et al. p. 253.

Patent Abstracts of Japan, vol. 10, No. 223 (P–483)(2279), Aug. 5, 1986 and JP–A–61 59338 (Fujitsu Limited), Mar. 26, 1986.

Patent Abstracts of Japan, vol. 10, No. 206 (P–478) (2262) Jul. 18, 1986 & JP–A–61 46751 (Fujitsu Ltd.), Mar. 7, 1986.

(List continued on next page.)

*Primary Examiner*—John S. Chu
*Attorney, Agent, or Firm*—Staas & Halsey

[57] ABSTRACT

A method for removing a used organic resist in a downstream ashing apparatus on a silicon semiconductor wafer in which water vapor is added to an oxygen plasma gas generated by microwaves. The addition of the water vapor lowers an activation energy of the ashing reaction and increases the reactive species generated in the plasma. Accordingly, the ashing rate is increased even at a wafer processing temperature as low as 150° C. The addition of water vapor increases the ashing rate for a wide range of the percentage of water content, such as 5 to 80%, allowing easy control of the process. The lowered operating temperature prevents contamination of the semiconductor wafer. Since $CF_4$ is not used the $SiO_2$ layer is protected from being undesirably etched and the semiconductor characteristics do not deteriorate.

45 Claims, 3 Drawing Sheets

OTHER PUBLICATIONS

Journal of Applied Physics, vol. 51, No. 6, Jun. 1980, "Optical Emission Spectroscopy of Reactive Plasmas: A Method for Correlating Emission Intensities to Reactive Particle Density", Coburn et al., pp. 3134–3136.

J. Electrochem. Soc.: Solid–State Science and Technology, Mar. 1977, vol. 124, No. 3, "The Effects of Geometry on Diffusion–Controlled Chemical Reaction Rates in a Plasma", James F. Battey, pp. 437–441.

J. Electrochem. Soc.: Solid–State Science and Technology, Dec. 1977, vol. 124, No. 12, "The Ultimate By–Products of Stripping Photoresist in an Oxygen Plasma", R.F. Reichelderfer et al., pp. 1926–1927.

METHOD OF STRIPPING A RESIST MASK

This application is a division of prior appliation Ser. No. 08/193,893, filed on Feb. 9, 1994 entitled METHOD OF STRIPPING A RESIST MASK, which is a continuation of prior application Ser. No. 08/069,402, filed Apr. 30, 1993, now abandoned, which is a continuation of application Ser. No. 07/590,595, filed Sep. 27, 1990, now abandoned, which is a continuation of prior application Ser. No. 07/232,096, filed Aug. 15, 1988, now abandoned.

BACKGROUND OF THE INVENTION

This invention is directed to a method of stripping a resist mask (referred to hereinafter as ashing).

As is well known, a mask made of an organic photoresist, etc., is necessarily employed in a photo-lithography technique for fabricating semiconductor devices. After the photoresist is exposed to light for the photo-lithography technique the resist must be removed. A dry plasma etching method, particularly a downstream ashing method, is widely used for removing the used photo-resist. A downstream etching apparatus which can be employed is disclosed in U.S. Pat. No. 4,512,868 by the present inventor. This apparatus has been used for processing a silicon wafer, etc., where the wafer is protected from being bombarded by charged plasma particles.

The reaction gas used for ashing the organic photo-resist is, for example, an oxygen gas including a $CF_4$ (carbon tetra-fluoride) gas. However, it is not always easy to remove the used resist. This is because the resist has been affected by its exposure to light during an exposure process and also its exposure to plasma during a prior silicon etching process, and therefore has become hardened. Furthermore, the $CF_4$ gas is apt to undesirably etch the silicon wafer.

For improving the ashing rate, there is a method in which nitrogen gas is added to oxygen containing a reaction gas for increasing the number of oxygen atoms as a reaction species. In this method, for example, in which the reaction gas contains 10% nitrogen, the ashing rate is 0.3 $\mu$m/minute at 180° C. The increase of the ashing rate achieved with this method is still limited, however, because the reactive species are mainly only the oxygen atoms. The function of the added nitrogen gas is considered to increase only the number of oxygen atoms as the reactive species.

Another method for increasing the number of oxygen atoms is by employing a known plasma etching method in which a small amount of water vapor is added to the oxygen plasma gas. However, no extensive study or application of this method has been carried out.

SUMMARY OF THE INVENTION

It is an object of the present invention to provide an improved ashing method for quickly stripping a used resist on a semiconductor wafer.

It is another object of the present invention to lower the activation energy of the reaction, and accordingly lower the reaction temperature.

It is still another object of the present invention to prevent deterioration of the semiconductor wafer caused by contamination due to a metal component contained in the resist.

It is a further object of the present invention to avoid the use of $CF_4$ gas so as to avoid an undesirable etching of a silicon wafer during the resist stripping, and accordingly prevent the lowering of the withstand voltage of an insulation layer.

According to the present invention a downstream etching apparatus is employed in which water vapor is added to an oxygen gas as a reaction gas. The amount of added water vapor is preferably more than 1 per cent of the total reaction gas with respect to the flow rate.

The addition of water vapor into the oxygen gas increases the reactive species and accordingly the ashing rate at a wafer processing temperature as low as 150° C. The lowered ashing temperature prevents metal atoms from contaminating the semiconductor wafer.

The above-mentioned features and advantages of the present invention, together with other objects and advantages which will become apparent, will be more fully described hereinafter, with reference being made to the accompanying drawings which form a part hereof, wherein like numerals refer to like parts throughout.

DESCRIPTION OF THE PREFERRED EMBODIMENTS

Figure 1:
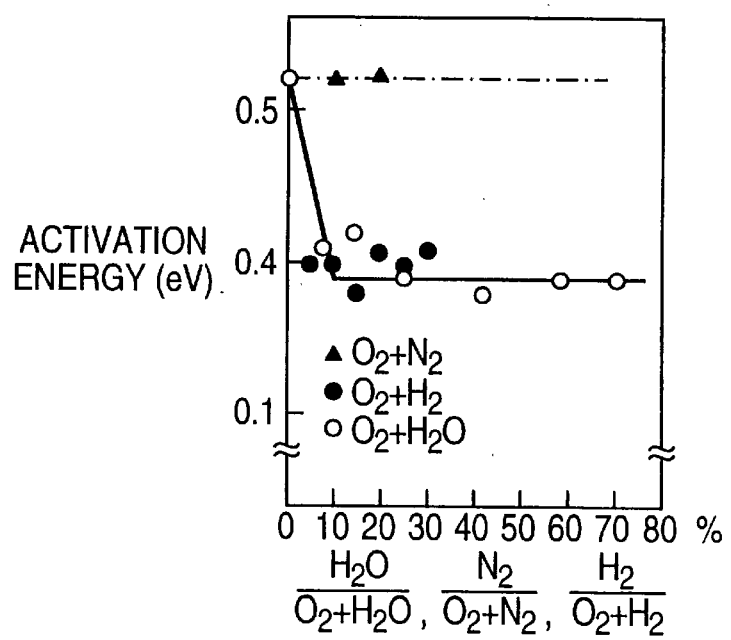
FIG. 1 is a graph of the effects of water on the activation energy added to various reaction gases.
Figure 2:
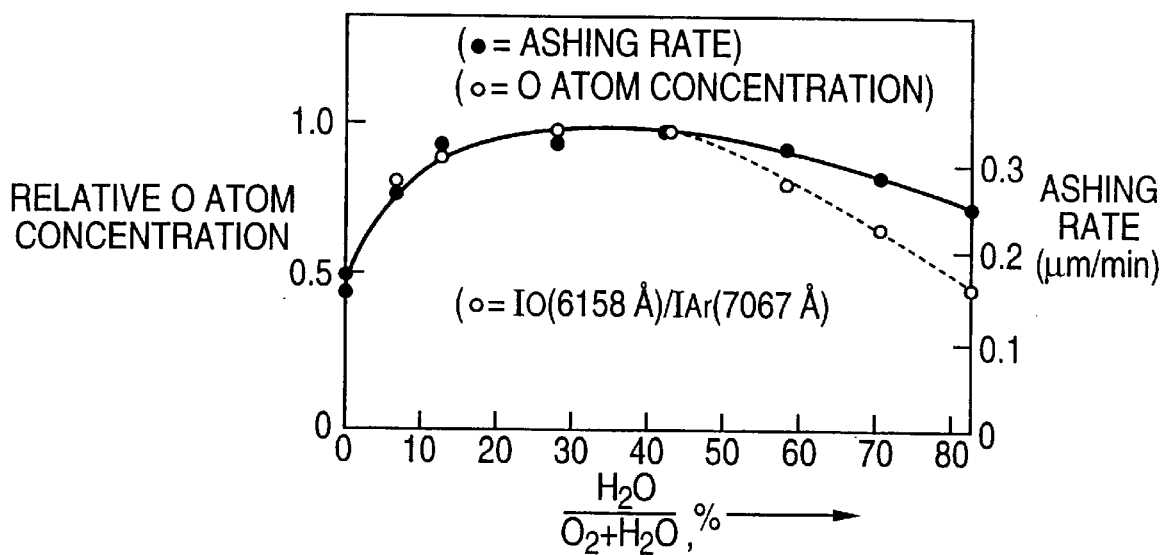
FIG. 2 is a graph of the effects of water added to an oxygen gas with respect to the ashing rate and the amount of atomic oxygen in the oxygen plasma according to the present invention.
Figure 3:
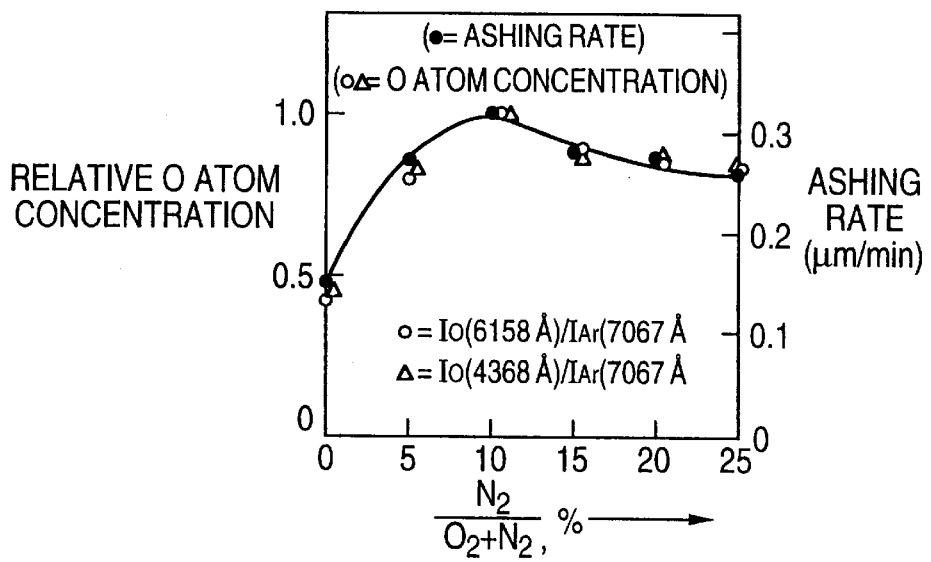
FIG. 3 is a graph of the effects of nitrogen added to an oxygen gas with respect to the ashing rate and the amount of atomic oxygen in prior art gas plasma.
Figure 4:
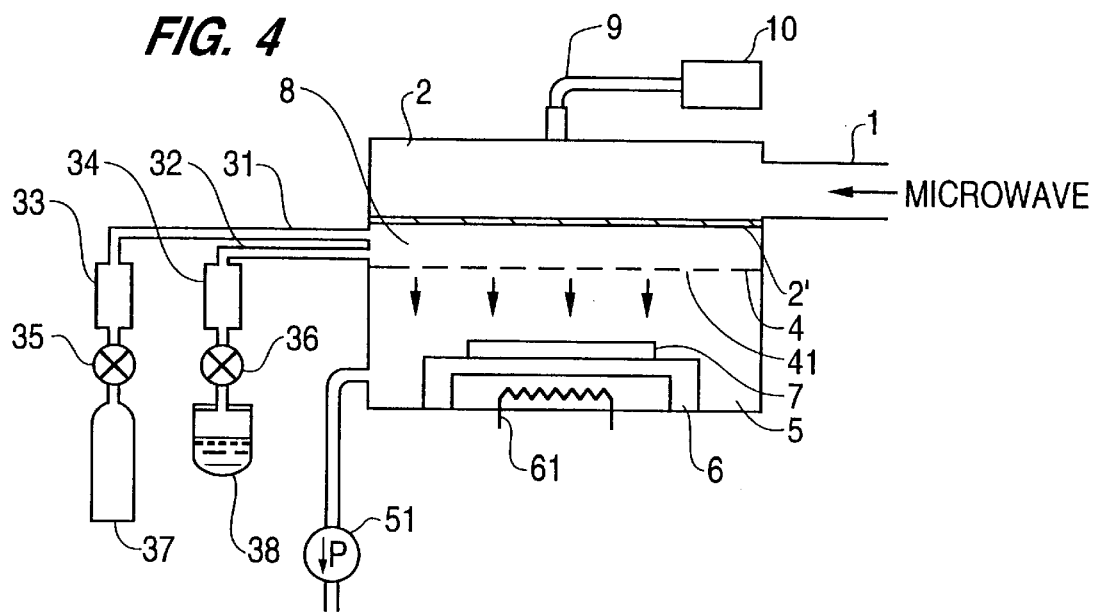
FIG. 4 is a downstream ashing apparatus according to an embodiment of the present invention.

Referring to FIG. 1 through FIG. 3, the effects of the present invention are presented. An apparatus used for obtaining the data in FIGS. 1 to 3 is schematically illustrated in FIG. 4. This apparatus is commonly used for downstream ashing, where microwaves, having a power of typically 2.45 GHz, are fed through a waveguide 1 into a microwave cavity 2. A plasma generating chamber 8 is a part of the cavity 2 and is vacuum-sealed by a quartz plate 2' which is transparent to the microwaves. Reaction gases of oxygen and water are fed from outside sources 37 and 38 through valves 35 and 36, and flow meters 33 and 34, respectively, to the plasma generating chamber 8. Accordingly, a plasma of the reaction gases is generated in the plasma generating chamber 8. On a wall 4, opposite to the quartz plate 2', of the plasma generating chamber 8 many small holes 41 are provided which connect the plasma generating chamber 8 to a reaction chamber 5 but act as a shield to the microwaves. A reactive species, such as oxygen atoms, generated in the plasma flows out of the plasma generating chamber 8 through the holes 41 into the relation chamber 5, as shown by arrows in FIG. 4. In the reaction chamber 5, a semiconductor wafer 7 to be processed is placed on a stage 6 in the flow of the reaction gas from the holes 41. The reactive species reacts with the resist on the semiconductor wafer 7. The temperature of the stage 6 is raised and controlled by a heater 61 installed in the stage. The reaction gas in the reaction chamber 5 is evacuated by a pump through an outlet 51.

With respect to the ashing process, the wafer 7 on the stage is heated to as high as approximately 200° C. while the chamber 5 is evacuated to approximately 0.01 Torr by the pump. Next, the inner pressure of the reaction chamber 5 is raised to a pressure of approximately 0.8 Torr and approximately 1.5 kW of power (via microwaves) is applied to the plasma generating chamber 8 so as to generate a gas plasma therein.

FIG. 1 is a graph of the effects on the activation energy of adding water, nitrogen or hydrogen to an oxygen gas, measured by their flow rate ratio. In FIG. 1 it is shown that the activation energy is lowered from approximately 0.5 eV to approximately 0.4 eV by adding hydrogen or water; however, no effect is observed by adding nitrogen. On the other hand, as is well known, a speed constant k of a chemical reaction is generally given by the following formula named Arrhenius' equation:

$$k=A \exp(-E/RT)$$

where A indicates a frequency factor, E indicates an activation energy, R indicates a gas constant and T indicates absolute temperature. Therefore, a lowered value of the activation energy means a faster reaction at a certain temperature. That is, a certain reaction speed is achieved at a lower temperature.

The effects of adding water were observed by the inventors, and are shown in FIG. 2. The results in FIG. 2 were obtained by using the apparatus in FIG. 4 under the conditions of a reaction gas flow of 1,000 cc/min, including adding oxygen gas having water vapor and 50 sccm of argon gas. The wafer temperature is kept at 180° C. The percentage of the water vapor content, $H_2O/(O_2+H_2O)$, is measured by flow rate. The argon gas, which has no effect on the ashing reaction, is added thereto just for generating a standard light spectrum with which oxygen atoms, etc., can be quantitatively compared using an actinometry technique, which is as reported by J. W. Coburn et al., "Journal Applied Physics", Vol. 51, No. 6, pp. 3134 (1980). A glass fiber 9 is installed on the wall of the cavity 2 to measure the light generated in the plasma through the transparent quartz plate 2, which is also optically transparent. Another end of the glass fiber 9 is connected to a monochromator 10. In FIG. 2, black dots indicate an ashing rate scaled by the right hand side vertical axis, and white dots indicate the relative oxygen atom concentration scaled by the left hand side vertical axis. The relative oxygen atom concentration is measured by an actinometry method, i.e., by the ratio of the intensity of a 6158 Å oxygen atom spectrum to the intensity of a 7067 Å argon spectrum.

It can be seen in FIG. 2 that an addition of approximately 10% to 60% water vapor almost doubles the ashing rate compared to when no water is added. The ashing rate is completely related to the amount of the oxygen atom concentration. However, in a range of over 50% water content, the ashing rate curve slowly falls but the oxygen atom concentration curve falls faster than the ashing rate curve. This separation of the oxygen atom concentration curve from the ashing rate curve suggests that another reactive species, such as an OH (hydroxide) radical, etc., is also contributing to the ashing reaction. For comparison, the effect of adding nitrogen to oxygen is shown in FIG. 3, for which the total gas flow and the temperature are the same as those in FIG. 2.

In FIG. 3, the black and white dots, respectively, represent the same thing as in FIG. 2, and the triangles represent a relative concentration of the oxygen atoms measured at a 4368 Å oxygen atom spectrum. In FIG. 2 and FIG. 3, the ashing rates are almost the same, i.e., 0.3 μm/minutes, at 180° C. When the activation energy is lowered, however, an ashing rate of 0.15 μm/minutes for 40% water-containing oxygen is achieved at as low as 150° C., compared with an ashing rate of 0.1 μm/minute for 10% nitrogen-containing oxygen which is optimum for the fastest ashing rate at the same temperature. These data are not shown in the figures. A lowered temperature for the ashing process is significantly advantageous in that the semiconductor wafer is protected from contamination by the metal components in the resist material. As is well known, metal contamination deteriorates the semiconductor properties, i.e., heavy metals lower the minority carrier generation lifetime, and alkaline metals contaminate the semiconductors.

As seen in FIG. 2, the curve of the ashing rate for water-containing oxygen is relatively flat over a wide range of water content, i.e., approximately 10% to 80%, and is much wider than the range of 5% to 15% for nitrogen-containing oxygen, as shown in FIG. 3. This is advantageous for easy control of an ashing operation during a production stage.

The beneficial advantage of avoiding the use of $CF_4$ is as follows. When 10% $CF_4$-containing oxygen gas is used for resist etching in a downstream apparatus, the $SiO_2$ layer on the semiconductor wafer is also undesirably etched. The ratio of the resist ashing rate to the $SiO_2$ etching rate, i.e., the selectivity, is typically 300 to 500. That is, while 1 μm of the resist is ashed, the $SiO_2$ is etched, for example, 30 Å. This undesirable etching of the underlying $SiO_2$ layer used for a gate insulation lowers the withstand voltage of the gate insulation, or deteriorates the electrical characteristics of the semiconductor circuits. The same problem exists with polycrystalline silicon, SiN, or aluminum, as well. This problem has not been so serious in fabricating conventional relatively low-density LSI (large scale integrated circuits) because the insulation layer is as thick as 1000 Å for a 16 K bit memory device. However, this problem is now becoming serious for fabricating the most up-to-date 1 M bit memory devices, because the insulation layer is as thin as 200 Å or less. According to the method of the present invention, there is no longer an undesirable etching problem of the $SiO_2$ layer or any other layer.

As described above, in the downstream ashing apparatus, the gas plasma, i.e., the electromagnetic power necessary for generating the plasma, is confined in the plasma generating chamber by a shielding wall 4. Only the reactive species generated in the plasma comes out via the small holes 41 in the shielding wall 4. The holes shield the electromagnetic waves but allow the reactive species to pass therethrough to react with the resist material. Therefore, the wafer is protected from bombardment by the charged particles, such as ions, which may cause deterioration of the semiconductor materials. Therefore, the reaction is purely chemical. The above-described beneficial effects of adding water vapor to an oxygen gas can be significantly enhanced by also combining the beneficial effects of the downstream apparatus. Therefore, the apparatus is highly appreciated in the production of VLSI (very large scale integrated circuits) especially with respect to, for example, submicron integration.

Figure 5:
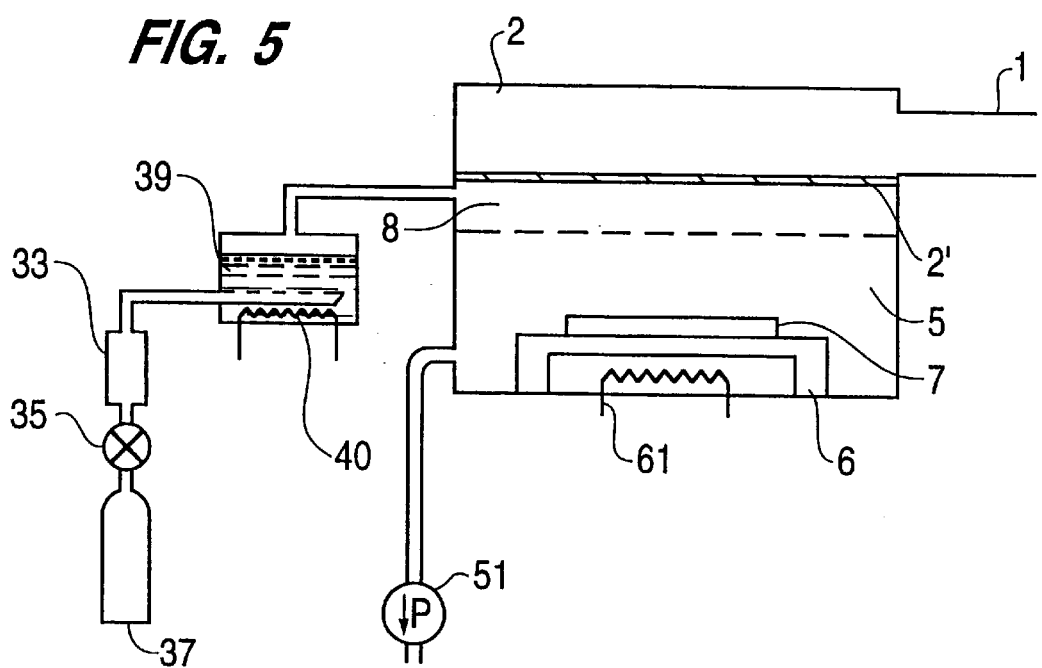
FIG. 5 is an apparatus for mixing the water vapor into oxygen gas according to the embodiment of the present invention.

Preferred typical methods of adding water vapor to oxygen gas are schematically illustrated in FIGS. 4 and 5. In FIG. 5, the same or equivalent parts are denoted by the same numbers as those in FIG. 4. In the apparatus of FIG. 4, the plasma generating chamber 8 is provided with two gas inlets 31 and 32 for introducing oxygen gas and water vapor respectively and independently from each other. Each gas is supplied to the inlet 31 and 32 from each gas source 37 and 38 through control valves 35 and 36 and flow meters 33 and 34, respectively. If the gases are to be fed into the plasma generating chamber 8 through a single inlet, the amount of mixing necessary to mix the water vapor into the oxygen gas is influenced by the amount of oxygen gas flow and the fluid resistance of the inlet pipe where the inlet pipe connects to the plasma generating chamber 8. In this apparatus, it is not easy to control a large amount of water vapor, for example, more than 10%, to be added to the oxygen gas because of the relatively high gas pressure of the oxygen gas caused by the fluid resistance of the inlet pipe. However, this problem can be solved.

In the apparatus of FIG. 5, the water vapor is mixed into the oxygen while the oxygen gas is flowing. That is, the water vapor is bubbled through heated water 39 on the way from the gas source 37 to the plasma generating chamber 8. The amount of added water vapor is determined by the balance of the vapor pressure of the heated water 39 at its present temperature and the pressure of the oxygen. The water vapor pressure can be raised and controlled by the temperature of the water through which the oxygen gas is flowing. The water temperature is controlled by the heater 40. Because of the relatively high vapor pressure of the heated water, a considerable amount, such as more than 10%, of water vapor can be easily mixed with precision into the oxygen gas.

In FIG. 1, the addition of a hydrogen gas into oxygen gas effectively lowers the activation energy. However, as is well known, a mixture of more than 3% hydrogen gas in oxygen gas will cause an explosion. Therefore, hydrogen gas cannot be industrially employed as a plasma reaction gas.

The many features and advantages of the invention are apparent from the detailed specification and thus, it is intended by the appended claims to cover all such features and advantages of the method which fall within the true spirit and scope of the invention. Further, since numerous modifications and changes may readily occur to those skilled in the art, it is not desired to limit the invention to the exact construction and operation shown and described, and accordingly, all suitable modifications and equivalents may be resorted to, falling within the scope of the invention.

What is claimed is:

1. A downstream ashing method for removing organic resist from a semiconductor wafer, comprising the steps of:
    placing the semiconductor wafer having the organic resist thereon in a reaction chamber;
    generating gas plasma in a plasma generating chamber by subjecting a gas mixture containing oxygen and water vapor to electromagnetic power, said plasma gas including a reactive species and charged particles,
    introducing only the reactive species from said plasma generating chamber to said reaction chamber while shielding the semiconductor wafer from said electromagnetic power and charged particles; and
    removing said organic resist on the semiconductor wafer by an ashing reaction between said resist and said reactive species in said reaction chamber.

2. The downstream ashing method according to claim 1, wherein said ashing reaction includes a second reactive species including hydroxide radicals and oxygen atoms.

3. The downstream ashing method according to claim 2, herein said second reactive species is supplied by the water vapor.

4. The downstream ashing method according to claim 2, wherein said second reactive species determines an ashing rate of said organic resist on the semiconductor wafer.

5. The downstream ashing method according to claim 1, wherein removing of said organic resist on the semiconductor wafer is performed quicker than removing of same by an ashing reaction associated with only oxygen atoms while maintaining an ashing temperature constant.

6. The downstream ashing method according to claim 1, wherein removing of said organic resist on the semiconductor wafer is performed at a lower ashing temperature than removing of same by an ashing reaction associated with only oxygen atoms while maintaining an ashing rate constant.

7. The downstream ashing method according to claim 1, wherein said ashing reaction is a purely chemical reaction.

8. The downstream ashing method according to claim 1, wherein said oxygen and water vapor are introduced separately into said plasma generating chamber from respective outside sources.

9. The downstream ashing method according to claim 1, wherein the semiconductor wafer includes an insulating layer having a thickness of 20 nm or less underlying said organic resist.

10. The downstream ashing method according to claim 9, wherein said insulating layer is a gate insulating layer of a submicron device for a very large scale integrated circuit.

11. The downstream ashing method according to claim 1, wherein an amount of said water vapor is preferably more than 1% of said gas mixture with respect to a flow rate.

12. The downstream ashing method according to claim 1, wherein removing of said organic resist on the semiconductor wafer is performed in a range of said water vapor between approximately 10% and 80% with respect to an ashing rate.

13. The downstream ashing method according to claim 1, wherein said reaction chamber is connected to said plasma generating chamber by a shielding wall having a hole through which said reactive species is introduced into said reaction chamber.

14. The downstream ashing method according to claim 13, wherein said shielding wall prevents said electromagnetic power and said charged particles from penetrating into said reaction chamber.

15. The downstream ashing method according to claim 1, wherein in advance of said gas mixture being introduced into said plasma generating chamber, said reaction chamber is evacuated to approximately 0.01 Torr in pressure by a pump.

16. The downstream ashing method according to claim 13, wherein the semiconductor wafer is placed on a stage in said reaction chamber such that the semiconductor wafer is parallel to said shielding wall.

17. The downstream ashing method according to claim 1, wherein a constant downstream of said reactive species is generated by introducing said oxygen and water vapor into said plasma generating chamber while said reaction chamber is evacuated by a pump.

18. The downstream ashing method according to claim 1, wherein said reactive species is free from a radical having a halogen atom.

19. A downstream ashing method for removing organic resist from a material to be processed, comprising the steps of:
    placing the material having the organic resist thereon in a reaction chamber;
    generating gas plasma in a plasma generating chamber by subjecting a gas mixture containing oxygen and water vapor to electromagnetic power, said gas plasma including a reactive species; and
    introducing said reactive species from said plasma generating chamber to said reaction chamber while shielding the material from said electromagnetic power, wherein said organic resist on the semiconductor wafer is removed through at least one ashing reaction with said reactive species in said reaction chamber.

20. A downstream ashing method for removing an organic resist film from a semiconductor wafer, comprising the steps of:

disposing the semiconductor wafer having the organic resist film thereon in a reaction chamber;

generating a gas plasma in a plasma generating chamber by subjecting a gas mixture to electromagnetic power, said gas plasma including reactive species of oxygen and OH (hydroxide); and introducing said reactive species of oxygen and OH (hydroxide) from said plasma generating chamber to said reaction chamber while shielding the semiconductor wafer from said electromagnetic power, wherein said organic resist film on the semiconductor wafer is removed by an ashing reaction with said reactive species of oxygen and OH (hydroxide) in said reaction chamber.

21. A downstream ashing method for removing a used organic resist on a semiconductor wafer, comprising the steps of:

(a) generating a gas plasma of an oxygen gas containing a water vapor by applying an electromagnetic power to a plasma generating chamber; and (b) introducing reactive species, generated in the gas plasma from the plasma generating chamber via holes, toward the semiconductor wafer to react with the used organic resist, the wall and holes in the plasma generating chamber essentially shielding the semiconductor wafer from the electromagnetic power, wherein the water vapor content is more than 1% of the total gas with respect to flow rate.

22. A downstream ashing method for removing a used organic resist according to claim 21, wherein the electromagnetic power is microwave power.

23. A downstream ashing method for removing a used organic resist according to claim 22, wherein frequency of the microwave power is approximately 2.45 GHz.

24. A downstream ashing method for removing a used organic resist on a semiconductor wafer, said method comprising the steps of:

(a) feeding a reaction gas of oxygen and water from outside sources through valves, and flow meters, to a plasma generating chamber;

(b) generating a plasma of the reaction gas in the plasma generating chamber;

(c) processing a semiconductor wafer in a reaction chamber which receives a reactive species which flows out of the plasma generating chamber through holes in a wall of the plasma generating chamber; and (d) reacting the reactive species with the resist on the semiconductor wafer.

25. A downstream ashing method according to claim 24, wherein the reaction chamber has a pressure of approximately 0.8 Torr.

26. A downstream ashing method according to claim 24, wherein the water vapor content is more than 1% of the total reaction gas with respect to flow rate.

27. A downstream ashing method according to claim 24, wherein the water is water vapor, further comprising the step of mixing the water vapor with the oxygen by bubbling the water vapor through heated water into the flowing oxygen gas.

28. A downstream ashing method according to claim 27, wherein more than 10% water vapor can be mixed with the oxygen gas.

29. A downstream ashing method for removing a used organic resist according to claim 1, wherein the electromagnetic power is microwave power.

30. A downstream ashing method for removing a used organic resist according to claim 29, wherein frequency of the microwave power is approximately 2.45 GHz.

31. A downstream ashing method according to claim 1, wherein the reaction chamber has a pressure of approximately 0.8 Torr.

32. A downstream ashing method according to claim 1, further comprising the step of mixing the water vapor with the oxygen by bubbling the water vapor through heated water into the oxygen.

33. A downstream ashing method according to claim 32, wherein more than 10% water vapor is mixed with the oxygen.

34. A downstream ashing method for removing a used organic resist according to claim 19, wherein an amount of said water vapor is more than 1% of said gas mixture with respect to a flow rate.

35. A downstream ashing method for removing a used organic resist according to claim 19, wherein the electromagnetic power is microwave power.

36. A downstream ashing method for removing a used organic resist according to claim 35, wherein frequency of the microwave power is approximately 2.45 GHz.

37. A downstream ashing method according to claim 19, wherein the reaction chamber has a pressure of approximately 0.8 Torr.

38. A downstream ashing method according to claim 19, further comprising the step of mixing the water vapor with the oxygen by bubbling the water vapor through heated water into the oxygen.

39. A downstream ashing method according to claim 38, wherein more than 10% water vapor is mixed with the oxygen.

40. A downstream ashing method according to claim 20, wherein an amount of said water vapor is more than 1% of said gas mixture with respect to a flow rate.

41. A downstream ashing method according to claim 20, wherein the electromagnetic power is microwave power.

42. A downstream ashing method for removing a used organic resist according to claim 41, wherein frequency of the microwave power is approximately 2.45 GHz.

43. A downstream ashing method according to claim 20, wherein the reaction chamber has a pressure of approximately 0.8 Torr.

44. A downstream ashing method according to claim 20, further comprising the step of mixing the water vapor with the oxygen by bubbling the water vapor through heated water into the oxygen.

45. A downstream ashing method according to claim 44, wherein more than 10% water vapor is mixed with the oxygen.

* * * * *

UNITED STATES PATENT AND TRADEMARK OFFICE
CERTIFICATE OF CORRECTION

Page 1 of 2

PATENT NO.: 5,998,104
DATED : December 7, 1999
INVENTOR(S): Shuzo FUJIMURA et al.

It is certified that [an/error[s]] appears in the above-identified patent and that said Letters Patent is hereby corrected as shown below:

IN THE COVER PAGE:

In [56] References Cited, please add the following references:

U.S. PATENT DOCUMENTS

| | | |
|---|---|---|
| --4,718,974 | 1/1988 | Minaee |
| 4,138,306 | 2/1979 | Niwa |
| 4,462,863 | 7/1984 | Nishimatsu et al. |
| 4,501,061 | 2/1985 | Wonnacott |
| 4,529,860 | 7/1985 | Robb |
| 4,673,456 | 6/1987 | Spencer et al. |
| 4,689,112 | 8/1987 | Bersin |
| 4,699,689 | 10/1987 | Bersin |
| 4,749,440 | 6/1988 | Blackwood et al. |
| 4,789,427 | 12/1988 | Fujimura et al. |
| 5,773,201 | 6/1998 | Fujimura et al.-- |

FOREIGN PATENT DOCUMENTS

| | | |
|---|---|---|
| --90,586 | 10/1983 | European Pat. Off. |
| 59-41838 | 3/1984 | Japan |
| 59-208838 | 11/1984 | Japan |
| 59-231817 | 12/1984 | Japan-- |

Signed and Sealed this

Twenty-fourth Day of October, 2000

*Attest:*

Q. TODD DICKINSON

*Attesting Officer*     *Director of Patents and Trademarks*

UNITED STATES PATENT AND TRADEMARK OFFICE
CERTIFICATE OF CORRECTION

PATENT NO.: 5,998,104
DATED : December 7, 1999
INVENTOR(S): Shuzo FUJIMURA et al.

It is certified that [an/error[s]] appears in the above-identified patent and that said Letters Patent is hereby corrected as shown below:

OTHER PUBLICATIONS

--J. Electrochem. Soc., vol. 134, No. 8, July 1987, "Spectroscopic Diagnostic of Photoresist Erosion in an Aluminum Etch Plasma", Ole Krogh et al., Solid State Science and Technology, pp. 2045-2048

Brown, Journal of Physical Chemistry, Vol. 71, No. 8, July 1967, "Effects of Impurities on the Production of Oxygen Atoms by a Microwave Discharge", pp. 2492-2495.--

[57] ABSTRACT

Please delete the Abstract in its entirety and replace with the following:

--A downstream ashing method for removing organic resist from a silicon semiconductor wafer. Oxygen gas and water vapor are fed from outside sources to a plasma generating chamber and a plasma is generated by microwaves in the plasma generating chamber. Only a reactive species, such as oxygen atoms, generated in the plasma, is allowed to flow from the plasma generating chamber into the reaction chamber. The microwaves are not allowed to pass into the reaction chamber. The reactive species chemically reacts with and removes the resist on the semiconductor wafer in the reaction chamber.--